United States Patent
Li et al.

(10) Patent No.: US 8,941,149 B2
(45) Date of Patent: Jan. 27, 2015

(54) SEMICONDUCTOR DEVICE

(71) Applicant: Furukawa Electric Co., Ltd., Tokyo (JP)

(72) Inventors: Jiang Li, Kanagawa (JP); Keishi Takaki, Kanagawa (JP); Ryosuke Tamura, Kanagawa (JP); Yoshihiro Ikura, Kanagawa (JP)

(73) Assignee: Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 13/938,557

(22) Filed: Jul. 10, 2013

(65) Prior Publication Data
US 2014/0117410 A1    May 1, 2014

(30) Foreign Application Priority Data
Oct. 29, 2012 (JP) .................. 2012-238429

(51) Int. Cl.
*H01L 31/072* (2012.01)
*H01L 29/872* (2006.01)
*H01L 29/778* (2006.01)
*H01L 29/40* (2006.01)
(Continued)

(52) U.S. Cl.
CPC .......... *H01L 29/872* (2013.01); *H01L 29/7786* (2013.01); *H01L 29/402* (2013.01); *H01L 29/42316* (2013.01); *H01L 29/2003* (2013.01)
USPC .................. 257/194; 257/E29.248

(58) Field of Classification Search
USPC .......... 257/192, 194, 284, E29.248; 438/167, 438/172
See application file for complete search history.

(56) References Cited

U.S. PATENT DOCUMENTS 8,120,064 B2 * 2/2012 Parikh et al. .................. 257/192
8,525,225 B2 * 9/2013 Kambayashi et al. ........ 257/192
(Continued)

FOREIGN PATENT DOCUMENTS

JP    2006-108676    4/2006
JP    2007-505501    3/2007
(Continued)

OTHER PUBLICATIONS

N.-Q. Zhang, et al., "High Breakdown GaN HEMT with Overlapping Gate Structure," IEEE Electron Device Letters, vol. 21, No. 9, Sep. 2000 (pp. 421-423).
(Continued)

*Primary Examiner* — Quoc Hoang
(74) *Attorney, Agent, or Firm* — Oblon, Spivak, McClelland, Maier & Neustadt, L.L.P.

(57) ABSTRACT

A semiconductor device includes: a first semiconductor layer formed on a substrate and formed of a nitride-based semiconductor; a second semiconductor layer formed on a surface of the first semiconductor layer and formed of a nitride-based semiconductor having a wider band-gap than the first semiconductor layer; first and second electrodes formed on a surface of the second semiconductor layer; an inter-electrode insulator film that is formed between the first and second electrodes on the surface of the second semiconductor layer; and a dielectric constant adjustment layer formed on the inter-electrode insulator film and formed of an electric insulator. The first electrode has a field plate portion formed so as to ride on the inter-electrode insulator film, and the dielectric constant adjustment layer has a first layer that contacts a lateral end portion of the field plate portion and a second layer formed on the first layer.

17 Claims, 6 Drawing Sheets

(51) Int. Cl.
    *H01L 29/423*    (2006.01)
    *H01L 29/20*     (2006.01)

(56) References Cited

U.S. PATENT DOCUMENTS

| | | |
|---|---|---|
| 2005/0051796 A1 | 3/2005 | Parikh et al. |
| 2005/0103213 A1 | 5/2005 | Dumm |
| 2006/0065908 A1 | 3/2006 | Beach |
| 2007/0235761 A1 | 10/2007 | Parikh et al. |
| 2009/0224288 A1 | 9/2009 | Parikh et al. |
| 2012/0132959 A1 | 5/2012 | Parikh et al. |
| 2012/0235210 A1 | 9/2012 | Takemae et al. |
| 2013/0228827 A1 | 9/2013 | Takemae et al. |
| 2013/0240911 A1 | 9/2013 | Beach |
| 2014/0264373 A1 | 9/2014 | Beach |

FOREIGN PATENT DOCUMENTS

| | | |
|---|---|---|
| JP | 2008-244002 | 10/2008 |
| JP | 2012-199285 | 10/2012 |
| JP | 2013-062494 | 4/2013 |

OTHER PUBLICATIONS

Japanese Office Action dated Sep. 30, 2014, in corresponding Japanese Patent Application No. 2012-238429 (with English Translation).

* cited by examiner

| DIELECTRIC CONSTANT $\varepsilon_r$ | BREAKDOWN VOLTAGE [V] |
|---|---|
| 1 | 250 |
| 1.9 | 400 |
| 3.5 | 600 |
| 4 | 674 |
| 5 | 812 |
| 6 | 950 |
| 7 | 1088 |
| 9 | 1364 |

SEMICONDUCTOR DEVICE

CROSS-REFERENCE TO RELATED APPLICATION

The present application claims priority to and incorporates by reference the entire contents of Japanese Patent Application No. 2012-238429 filed in Japan on Oct. 29, 2012.

BACKGROUND OF THE INVENTION

1. Field of the Invention

The present disclosure relates to a semiconductor device.

2. Description of the Related Art

Wide band-gap semiconductors have high breakdown voltage, good electronic transport property, and good thermal conductivity, and thus are very appealing as a material for high temperature, high power, or high frequency semiconductor devices. A typical wide band-gap semiconductor is a nitride-based semiconductor, which is made of GaN, AlN, InN, BN, or a mixed crystal of at least two of GaN, AlN, InN, and BN. Further, in a semiconductor device that has an AlGaN/GaN hetero-junction structure, for example, two-dimensional electron gas is generated at an hetero-junction interface by the piezoelectric effect. The two-dimensional electron gas has high electron mobility and high carrier density. Therefore, semiconductor devices having such an AlGaN/GaN hetero-junction structure, like Schottky barrier diodes or field effect transistors, for example, have high voltage endurance, low on-resistance, and fast switching speed, and are very suitable for power switching applications.

Further, a device having an AlGaN/GaN hetero-junction structure is disclosed, in which a Schottky electrode rides on a surface protection film that is formed on a surface of a semiconductor layer and formed of an electric insulator, and forms a field plate structure, in order to realize higher voltage endurance (refer to "N. Zhang, U. K. Mishra, "High Breakdown GaN HEMT with Overlapping Gate Structure", IEEE Electron Device Letters, vol. 21, no. 9, 2000").

In a semiconductor device having a hetero-junction structure, in order to reduce its on-resistance or suppress occurrence of current collapse, a carrier density of its two-dimensional electron gas is preferably increased. If the carrier density of the two-dimensional electron gas is increased, however, intense electrical field concentration tends to occur in the device when a reverse voltage is applied to the device (e.g., in a Schottky barrier diode, when a reverse voltage is applied between an anode electrode and a cathode electrode). This causes reduction of voltage endurance and current collapse of the device.

Accordingly, there is a need to provide a semiconductor device in which reduction of on-resistance or suppression of current collapse is achieved and reduction of voltage endurance is prevented.

SUMMARY OF THE INVENTION

According to an aspect of the present invention, a semiconductor device includes: a first semiconductor layer that is formed on a substrate and formed of a nitride-based semiconductor; a second semiconductor layer that is formed on a surface of the first semiconductor layer and formed of a nitride-based semiconductor having a wider band-gap than the first semiconductor layer; a first electrode that is formed on a surface of the second semiconductor layer; a second electrode that is formed on the surface of the second semiconductor layer; an inter-electrode insulator film that is formed between the first electrode and the second electrode on the surface of the second semiconductor layer; and a dielectric constant adjustment layer that is formed on the inter-electrode insulator film and formed of an electric insulator. The first electrode has a field plate portion formed so as to ride on the inter-electrode insulator film, and the dielectric constant adjustment layer has a first dielectric constant adjustment layer that contacts a lateral end portion of the field plate portion and a second dielectric constant adjustment layer formed on the first dielectric constant adjustment layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
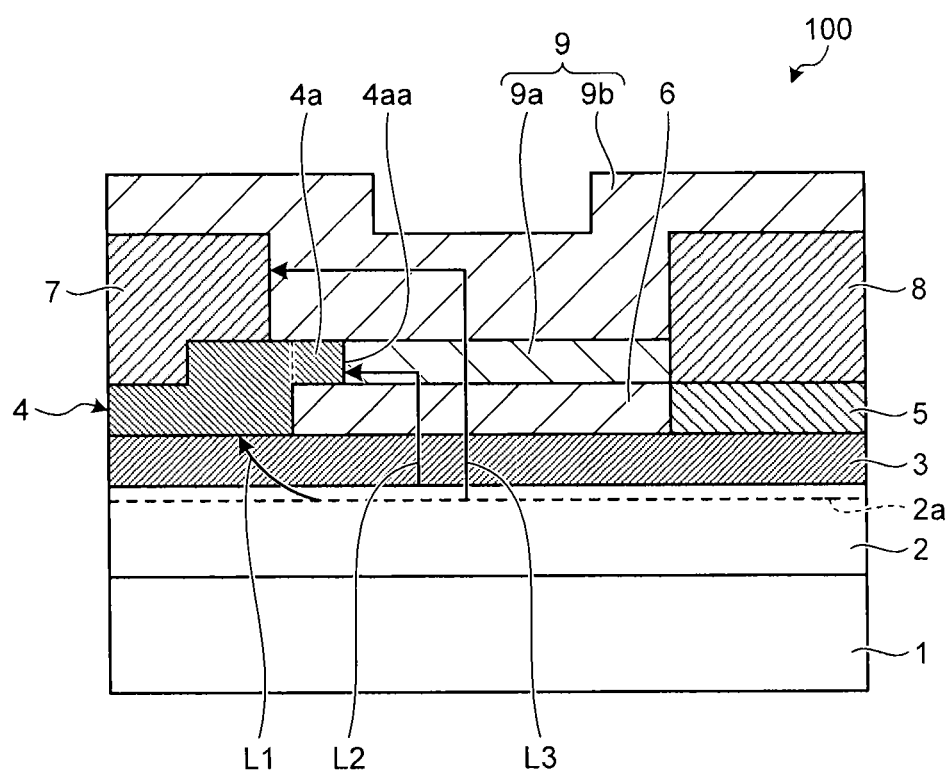
FIG. 1 is a schematic cross-sectional view of a semiconductor device according to a first embodiment.

Hereinafter, embodiments of a semiconductor device according to the present invention will be described in detail with reference to the drawings. The present invention is not limited by the following embodiments. In the drawings, the same or corresponding elements are designated by the same reference numerals or symbols as appropriate. Furthermore, it is to be noted that the drawings are schematic, and relations among dimensions of the elements may differ from the actual. Portions having relations or ratios among their dimensions that differ among the drawings may be included.

First Embodiment

FIG. 1 is a schematic cross-sectional view of a semiconductor device according to a first embodiment of the present invention. This semiconductor device 100 is a Schottky barrier diode and includes: a first semiconductor layer 2; a second semiconductor layer 3; a first electrode 4; a second electrode 5; an inter-electrode insulator film 6; wiring metals 7 and 8; and a dielectric constant adjustment layer 9, which are formed on a substrate 1.

The substrate 1 is a base layer for the first semiconductor layer 2 and, for example, has a structure in which a desired semiconductor layer, such as a buffer layer as appropriate, is formed on a substrate made of Si, SiC, sapphire, GaN, or the like. Accordingly, a desired layer may be interposed between the substrate and the first semiconductor layer 2.

The first semiconductor layer 2 is a layer formed of a nitride-based semiconductor and functions as an electron transit layer. The second semiconductor layer 3 is formed on a surface of the first semiconductor layer 2, is formed of a nitride-based semiconductor having a wider band-gap than the first semiconductor layer 2, and functions as an electron supply layer. For example, the first semiconductor layer 2 is made of GaN and the second semiconductor layer 3 is made of AlGaN, but the nitride-based semiconductor materials forming the first semiconductor layer 2 and the second semiconductor layer 3 are not particularly limited, as long as their band-gaps satisfy a desired relation.

A layer thickness of the second semiconductor layer 3 is 1 nm to 50 nm, for example, and preferably 20 nm to 25 nm. Further, an Al composition of the second semiconductor layer 3 is 25%, for example, but may be 10% to 50%, and more preferably 20% to 35%.

The inter-electrode insulator film 6 is formed between the first electrode 4 and the second electrode 5 on the surface of the second semiconductor layer 3, and is formed of an electric insulator made of SiN, $SiO_2$, or $Al_2O_3$, for example.

The first electrode 4 is formed on the surface of the second semiconductor layer 3. The first electrode 4 forms a Schottky contact with the second semiconductor layer 3 and has a field plate portion 4a formed so as to ride on the inter-electrode insulator film 6 on the second semiconductor layer 3. The first electrode 4 has a Ni/Au structure, for example. This first electrode 4 functions as an anode electrode. The second electrode 5 is formed on the surface of the second semiconductor layer 3 with the inter-electrode insulator film 6 between the first electrode 4 and the second electrode 5, and forms an ohmic contact with the second semiconductor layer 3. The second electrode 5 has a Ti/Al structure, for example. This second electrode 5 functions as a cathode electrode.

The wiring metal 7 is formed on the first electrode 4. The wiring metal 8 is formed on the second electrode 5. The wiring metals 7 and 8 are made of a metal for wiring, such as Al or Au.

The dielectric constant adjustment layer 9 is formed on the inter-electrode insulator film 6 and formed of an electric insulator. The dielectric constant adjustment layer 9 has: a first dielectric constant adjustment layer 9a facing the inter-electrode insulator film 6 and contacting a lateral end portion 4aa of the field plate portion 4a of the first electrode 4; and a second dielectric constant adjustment layer 9b formed on the first dielectric constant adjustment layer 9a.

The second semiconductor layer 3 has a wider band-gap than the first semiconductor layer 2, and thus two-dimensional electron gas 2a as a carrier is generated at an interface between the first semiconductor layer 2 and the second semiconductor layer 3 due to the piezoelectric effect. A carrier density Ns of the two-dimensional electron gas 2a is of the order of $1 \times 10^{12}$ $cm^{-2}$ to $2 \times 10^{13}$ $cm^{-2}$, for example.

As described above, for the on-resistance and the current collapse property between the anode electrode (the first electrode 4) and the cathode electrode (the second electrode 5) upon application of a positive voltage between the anode electrode and the cathode electrode, the carrier density of the two-dimensional electron gas 2a is preferably high, and preferably set to $1 \times 10^{13}$ $cm^{-2}$, for example.

However, when a reverse voltage is applied between the anode electrode and the cathode electrode, the two-dimensional electron gas 2a is gradually depleted from the first electrode 4 side. When this happens, electrical field is concentrated to the lateral end portion 4aa of the field plate portion 4a of the first electrode 4, and because the higher the carrier density of the two-dimensional electron gas 2a is, the higher the intensity of the concentrated field becomes, the voltage endurance is lowered.

In this respect, in the semiconductor device 100, because the first dielectric constant adjustment layer 9a formed of an electric insulator is in contact with the lateral end portion 4aa of the field plate portion 4a, the depletion of the two-dimensional electron gas 2a becomes easier to extend along the first dielectric constant adjustment layer 9a. This mitigates the concentration of electric field to the lateral end portion 4aa. As a result, in the semiconductor device 100, the carrier density of the two-dimensional electron gas 2a is increased to be able to achieve reduction of on-resistance or suppression of current collapse, and to prevent reduction of voltage endurance. Further, the first dielectric constant adjustment layer 9a is located above the two-dimensional electron gas 2a and has an effect of pulling out the two-dimensional electron gas 2a, which is a carrier, from above, when a reverse voltage is applied. This makes the two-dimensional electron gas 2a depleted before the electric field at the lateral end portion 4aa become too high. Accordingly, the reduction of voltage endurance in the semiconductor device 100 is further prevented.

For such effects of facilitating the extending of depletion and of pulling out the carrier to be demonstrated, a higher dielectric constant of the first dielectric constant adjustment layer 9a is preferable. To describe with reference to FIG. 1, arrows L1, L2, and L3 in FIG. 1 represent paths of pulling out the carrier from the two-dimensional electron gas 2a and will be called path 1, path 2, and path 3, respectively. The path 1 represents a path of pulling out from a bottom surface of the first electrode 4, the path 2 represents a path of pulling out from the lateral end portion 4aa of the field plate portion 4a of the first electrode 4 through the first dielectric constant adjustment layer 9a and the inter-electrode insulator film 6, and the path 3 represents a path of pulling out from the wiring metal 7 through the second dielectric constant adjustment layer 9b, the first dielectric constant adjustment layer 9a, and the inter-electrode insulator film 6. An electric charge pulled out through the path 2 is determined by a capacity at an interface between the lateral end portion 4aa of the field plate portion 4a of the first electrode 4 and the first dielectric constant adjustment layer 9a, a capacity at an interface between the lateral end portion 4aa of the field plate portion 4a of the first electrode 4 and the inter-electrode insulator film 6, a capacity of the inter-electrode insulator film 6, and the like, and thus to increase the effect of pulling out the carrier, a higher dielectric constant of the first dielectric constant adjustment layer 9a is preferable. Further, the effect of pulling out the electric charge via the path 3 is small because a distance between the wiring metal 7 and the two-dimensional electron gas 2a is large.

Figure 2:
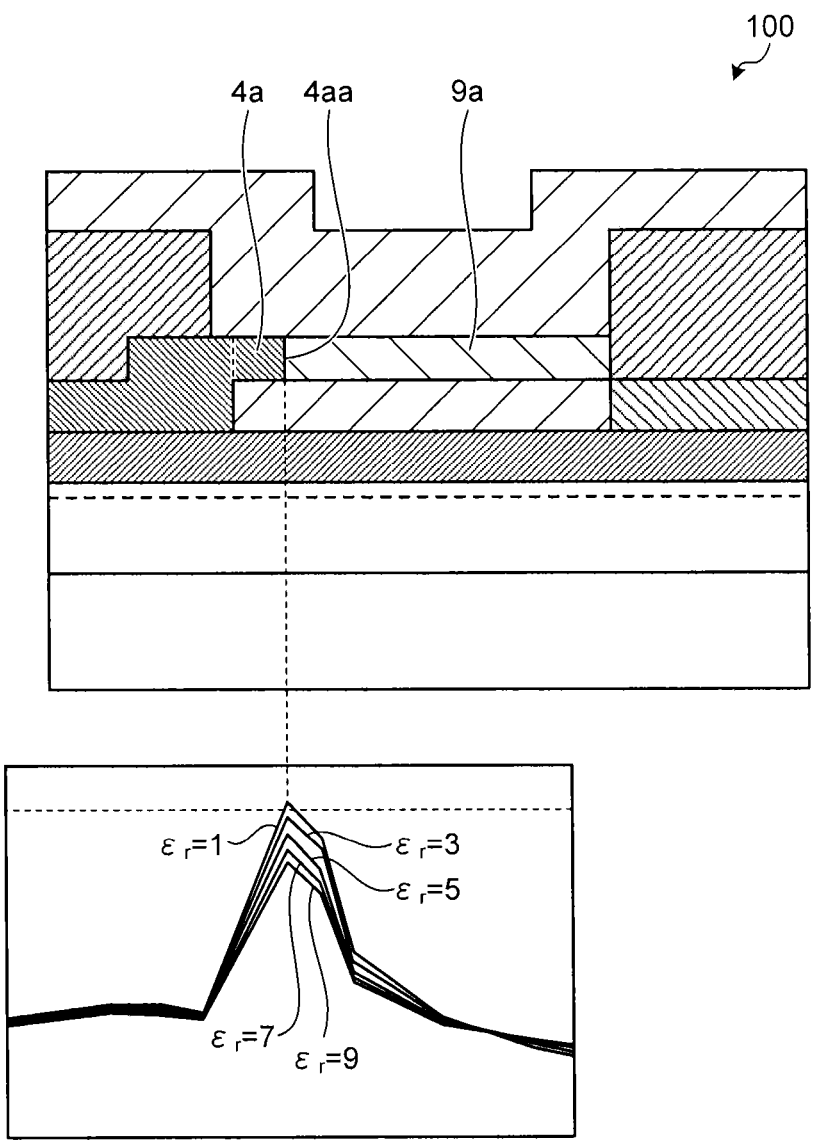
FIG. 2 is a diagram illustrating an example of electric field intensity distributions generated in the semiconductor device illustrated in FIG. 1.

FIG. 2 is a diagram of an example of electric field intensity distributions generated in the semiconductor device illustrated in FIG. 1. A graph illustrated below the semiconductor device 100 is a graph that illustrates, by enlarging in a width direction, the electric field intensity distributions in the vicinity of the lateral end portions 4aa of the field plate portions 4a upon application of a reverse voltage. When a dielectric constant $\in_r 1$ of the first dielectric constant adjustment layer 9a is changed to 1, 3, 5, 7, and 9, the peak value of the electric field intensity decreases as illustrated in the graph. Accordingly, the higher the dielectric constant of the first dielectric constant adjustment layer 9a, the more the concentration of electric field to the lateral end portion 4aa is mitigated. Further, FIG. 2 illustrates values of dielectric breakdown fields when the inter-electrode insulator film 6 is made of $SiO_2$. From FIG. 2, the dielectric constant $\in_r 1$ of the first dielectric constant adjustment layer 9a is preferably three or larger, so that the electric field intensity in the inter-electrode insulator film 6 in the vicinity of the lateral end portion 4aa becomes smaller than the dielectric breakdown field of the inter-electrode insulator film 6.

The first dielectric constant adjustment layer 9a contacts the lateral end portion 4aa of the field plate portion 4a of the first electrode 4, and a layer thickness of the first dielectric constant adjustment layer 9a is about the same as the field plate portion 4a. The layer thickness of the first dielectric constant adjustment layer 9a is several hundred nanometers, for example. A length of the field plate portion 4a is 4 μm, for example.

The first dielectric constant adjustment layer 9a may be formed of a material, which has been adjusted to have a desired dielectric constant and includes any one of or any combination as appropriate of: a material that includes at least one of $SiO_2$, $Si_3N_4$, $Al_2O_3$, and MgO; a material that includes a polyimide film in which ceramic particles having a high dielectric constant have been mixed, the ceramic particles including at least one of $TiO_2$, $SiO_2$, $Al_2O_3$, HfO, ZrO, $HfSi_xO_y$, and $ZrSi_xO_y$; a material that includes a polymeric material including at least one metal of Cu, Ni, Ag, Al, Zn, Co, Fe, and Mn; a material that includes a silicone resin material; and a material that includes a high-dielectric polymeric material.

The second dielectric constant adjustment layer 9b may be formed of a material having the same dielectric constant as the first dielectric constant adjustment layer 9a. In particular, if the first dielectric constant adjustment layer 9a and the second dielectric constant adjustment layer 9b are made of the same material, the dielectric constant adjustment layer 9 may be regarded as being substantially of a single-layer structure. In that case, if the dielectric constant of the second dielectric constant adjustment layer 9b is $\in_r 2$, $\in_r 1 = \in_r 2$.

However, if the second dielectric constant adjustment layer 9b is to have a function of insulating between the wiring metal 7 and the wiring metal 8, a layer thickness of the second dielectric constant adjustment layer 9b is several micrometers. When the second dielectric constant adjustment layer 9b is as thick as this, if the dielectric constant is high, a parasitic capacitance of the semiconductor device 100 is increased. Therefore, in order to achieve the semiconductor device 100 having a high-speed switching property, if the dielectric constant of the second dielectric constant adjustment layer 9b is $\in_r 2$, preferably $\in_r 2 < 9$ and $\in_r 1 > \in_r 2$. Accordingly, a relational expression $\in_r 1 \geq \in_r 2$ is held between $\in_r 1$ and $\in_r 2$.

If $\in_r 2$ is too low, when a reverse voltage is applied, the insulation is too high and electrical discharge between the wiring metals may occur. In order to prevent this, preferably $1.5 < \in_r 2$.

In a more specific example, the field plate portion 4a of the first electrode 4 has a layer thickness of 350 nm, and the first dielectric constant adjustment layer 9a has about the same layer thickness. The inter-electrode insulator film 6 is made of $SiO_2$ having a dielectric constant of 3.8. The first dielectric constant adjustment layer 9a is made of a polyimide having a dielectric constant $\in_r 1$ of 3.5. The second dielectric constant adjustment layer 9b is made of a polyimide having a dielectric constant $\in_r 2$ of 3.0.

In another specific example, the field plate portion 4a of the first electrode 4 has a layer thickness of 350 nm, and the first dielectric constant adjustment layer 9a has about the same layer thickness. The inter-electrode insulator film 6 is made of $SiO_2$ having a dielectric constant of 3.8. The first dielectric constant adjustment layer 9a is made of $SiO_2$ having a dielectric constant $\in_r 1$ of 3.8. The second dielectric constant adjustment layer 9b is made of a polyimide having a dielectric constant $\in_r 2$ of 3.0.

In still another specific example, the field plate portion 4a of the first electrode 4 has a layer thickness of 350 nm, and the first dielectric constant adjustment layer 9a has about the same layer thickness. The inter-electrode insulator film 6 is made of $SiO_2$ having a dielectric constant of 3.8. The first dielectric constant adjustment layer 9a is made of $Si_3N_4$ having a dielectric constant $\in_r 1$ of 7.9. The second dielectric constant adjustment layer 9b is made of a polyimide having a dielectric constant $\in_r 2$ of 3.0.

A semiconductor device having the structure illustrated in FIG. 1 was fabricated as an example of the present invention, and its voltage endurance and current collapse property were measured. As for properties of the fabricated semiconductor device, the first semiconductor layer was a GaN layer having a layer thickness of 700 nm; the second semiconductor layer was an $Al_{0.25}Ga_{0.75}N$ layer having a layer thickness of 30 nm; the inter-electrode insulator film was a $SiO_2$ film having a film thickness of 600 nm; the field plate portion had a length of 4 μm and a thickness of 350 nm; the first dielectric constant adjustment layer was a polyimide having a layer thickness of 350 nm; the wiring metal had a thickness of 5 μm; and the second dielectric constant adjustment layer had a layer thickness of 6 μm. A distance between the anode electrode and the cathode electrode (Lac) was 10 μm.

Figure 3:
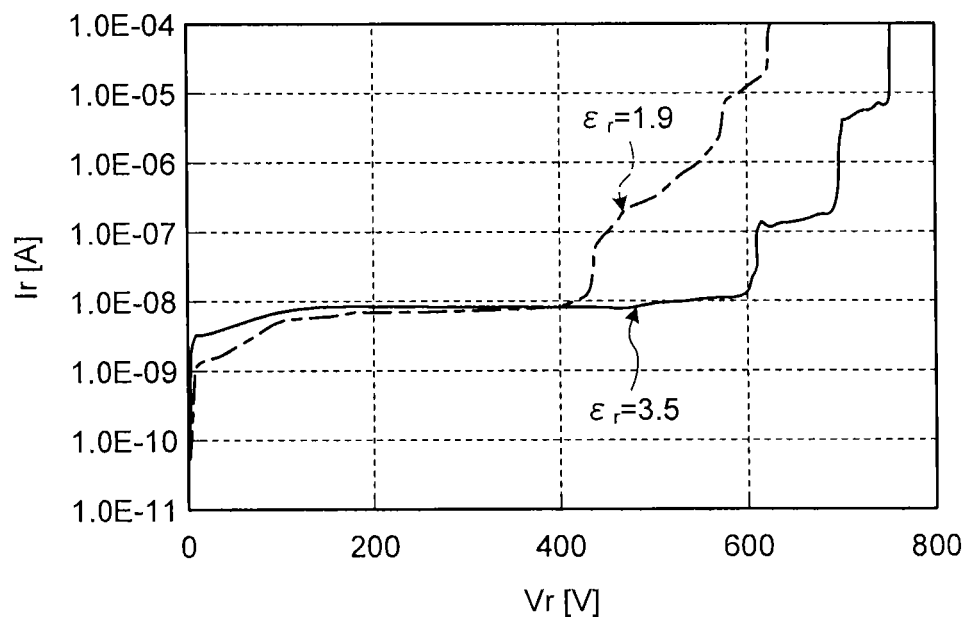
FIG. 3 is a diagram illustrating an example of leakage current properties of semiconductor devices according to a first example and a second example.

FIG. 3 is a diagram illustrating leakage current properties of semiconductor devices according to a first example and a second example. In these first and second examples, dielectric constants of their first dielectric constant adjustment layers were set to 1.9 and 3.5, respectively. In FIG. 3, the horizontal axis represents reverse voltage Vr and the vertical axis represents leakage current Ir under the reverse voltage. A value of the reverse voltage when the leakage current increases sharply, is determined as a breakdown voltage herein.

Figure 4:
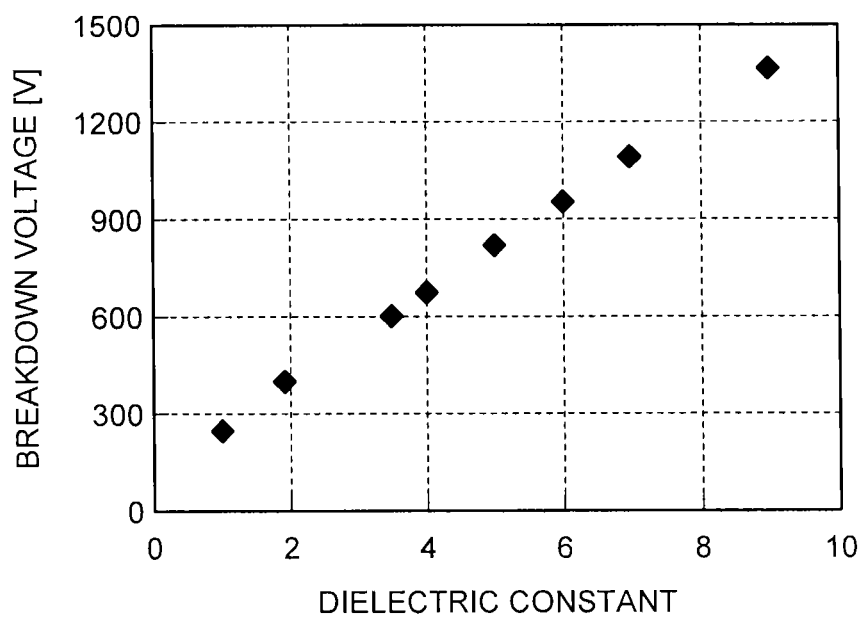
FIG. 4 is a diagram illustrating a relation between dielectric constants and breakdown voltages of first dielectric constant adjustment layers according to examples of the present invention.
Figures 5, 6:
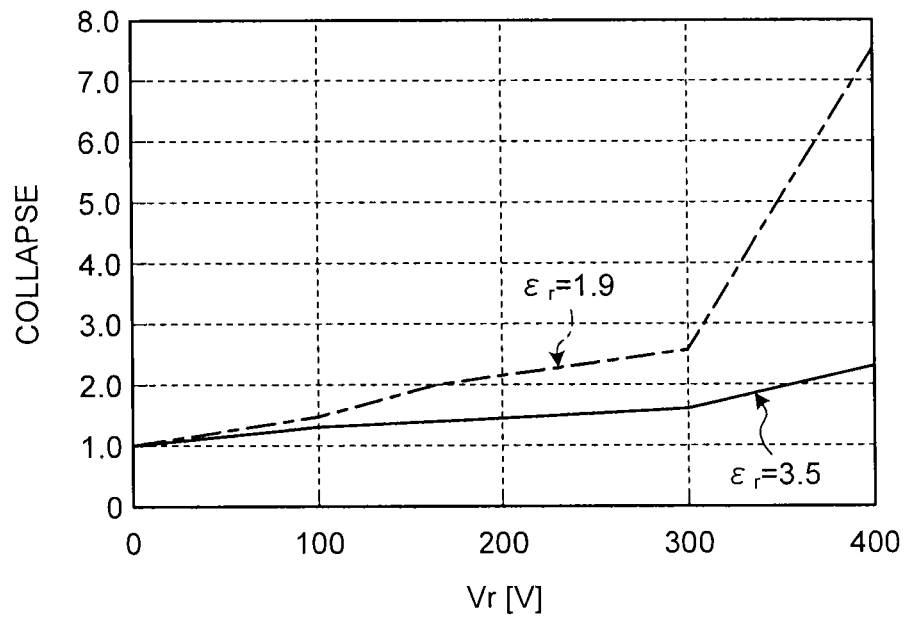
FIG. 5 is a table listing numerical values of data points illustrated in FIG. 4.
FIG. 6 is a diagram of an example of current collapse properties of the semiconductor devices according to the first and second examples.

Leakage current properties of semiconductor devices having various dielectric constant values of their first dielectric constant adjustment layers were measured and their breakdown voltages were measured thereby. FIG. 4 is a diagram illustrating a relation between the dielectric constants and the breakdown voltages of the first dielectric constant adjustment layers according to examples of the present invention. FIG. 5 is a table listing numerical values of data points illustrated in FIG. 4. As illustrated in FIGS. 4 and 5, it was confirmed that the larger the dielectric constant of the first dielectric constant adjustment layer, the higher the breakdown voltage.

Table 1 below illustrates simulation results for ratios of electric charges pulled out through the path 2 to electric charges pulled out through the path 1 illustrated in FIG. 1, when the inter-electrode insulator film 6 is made of $SiO_2$ (its dielectric constant being 3.8), the dielectric constant $\in_r 1$ of the first dielectric constant adjustment layer 9a is changed to 1, 3, 5, 7, and 9, and a reverse voltage of 400 V is applied. The carrier density Ns of the two-dimensional electron gas 2a is $1 \times 10^{13}$ $cm^{-2}$. As illustrated in Table 1, the larger the dielectric constant $\in_r 1$ of the first dielectric constant adjustment layer 9a, the more the ratio of the electric charges pulled out tends to be saturated, and the dielectric constant $\in_r 1$ of the first dielectric constant adjustment layer 9a is preferably three or larger so that the ratio of the electric charges pulled out becomes 65% or larger. The dielectric constant $\in_r 1$ is preferably nine or smaller so that formation of the first dielectric constant adjustment layer 9a becomes easy.

TABLE 1

| $\in_r 1$ | Ratio of electric charges pulled out (path 2/path 1) |
|---|---|
| 1 | 55% |
| 3 | 65% |
| 5 | 70% |
| 7 | 73% |
| 9 | 75% |

Next, current collapse properties of the semiconductor devices of the first example and the second example were measured. FIG. 6 is a diagram illustrating an example of the current collapse properties of the semiconductor devices according to the first and second examples. In FIG. 6, the horizontal axis represents reverse voltage Vr and the vertical axis represents collapse. The collapse is an amount defined by Ra/Rb, when an on-resistance of the semiconductor device before a reverse voltage is applied is Rb and an on-resistance of the semiconductor device after the reverse voltage is applied is Ra. Therefore, the larger the value of the collapse, the more the current property is deteriorated. As illustrated in FIG. 6, it was confirmed that the larger the dielectric constant of the first dielectric constant adjustment layer, the more the current collapse property improved.

Second Embodiment

Figure 7:
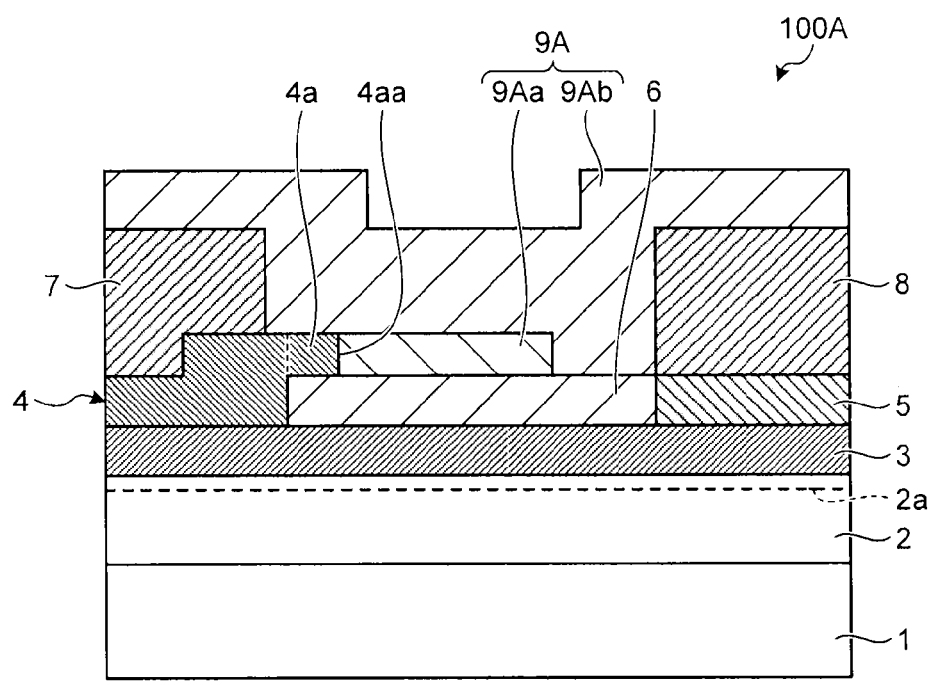
FIG. 7 is a schematic cross-sectional view of a semiconductor device according to a second embodiment.

FIG. 7 is a schematic cross-sectional view of a semiconductor device according to a second embodiment of the present invention. As illustrated in FIG. 7, this semiconductor device 100A has a structure in which the dielectric constant adjustment layer 9 in the semiconductor device 100 according to the first embodiment illustrated in FIG. 1 is substituted with a dielectric constant adjustment layer 9A.

The dielectric constant adjustment layer 9A is formed on the inter-electrode insulator film 6 and formed of an electric insulator. The dielectric constant adjustment layer 9A has: a first dielectric constant adjustment layer 9Aa that faces the inter-electrode insulator film 6 and contacts the lateral end portion 4aa of the field plate portion 4a of the first electrode 4; and a second dielectric constant adjustment layer 9Ab formed on the first dielectric constant adjustment layer 9Aa.

Materials forming the first dielectric constant adjustment layer 9Aa and the second dielectric constant adjustment layer 9Ab, and preferable values of their dielectric constants, layer thicknesses, and the like may be the same as their corresponding first dielectric constant adjustment layer 9a or second dielectric constant adjustment layer 9b. While the first dielectric constant adjustment layer 9a of the semiconductor device 100 is formed entirely on the inter-electrode insulator film 6 up to the second electrode 5, the first dielectric constant adjustment layer 9Aa of the semiconductor device 100A is formed partially on the inter-electrode insulator film 6 from the lateral end portion 4aa of the field plate portion 4a toward the second electrode (cathode electrode) 5. A part of the second dielectric constant adjustment layer 9Ab covers a surface of the inter-electrode insulator film 6 on the second electrode 5 side.

Also in this semiconductor device 100A, like the semiconductor device 100, the first dielectric constant adjustment layer 9Aa demonstrates the effect of facilitating the extending of the depletion and the effect of pulling out the carrier. As a result, the carrier density of the two-dimensional electron gas 2a is able to be increased to reduce the on-resistance or suppress the current collapse, and to prevent the reduction of the voltage endurance.

In a specific example, the field plate portion 4a of the first electrode 4 has a layer thickness of 350 nm, and the first dielectric constant adjustment layer 9Aa has a layer thickness of about the same. The inter-electrode insulator film 6 is made of $SiO_2$ having a dielectric constant of 3.8. The first dielectric constant adjustment layer 9Aa is made of $Si_3N_4$ having a dielectric constant $\in_r 1$ of 7.9. The second dielectric constant adjustment layer 9Ab is made of a polyimide having a dielectric constant $\in_r 2$ of 3.0. An amount of the carrier pulled out from the lateral end portion 4aa of the field plate portion 4a of the first electrode 4 changes depending on a capacity between the lateral end portion 4aa and a top surface of the inter-electrode insulator film 6. Therefore, when the first dielectric constant adjustment layer 9Aa made of $Si_3N_4$ having the dielectric constant $\in_r 1$ of a large value is formed in the vicinity of the lateral end portion 4aa and the second dielectric constant adjustment layer 9Ab made of a polyimide having the dielectric constant $\in_r 2$ of a relatively small value is formed in the other region, a capacity between the wiring metals 7 and 8 is able to be further reduced as compared with an example in which the first dielectric constant adjustment layer 9Aa made of $Si_3N_4$ is formed on the entire surface.

Third Embodiment

Figure 8:
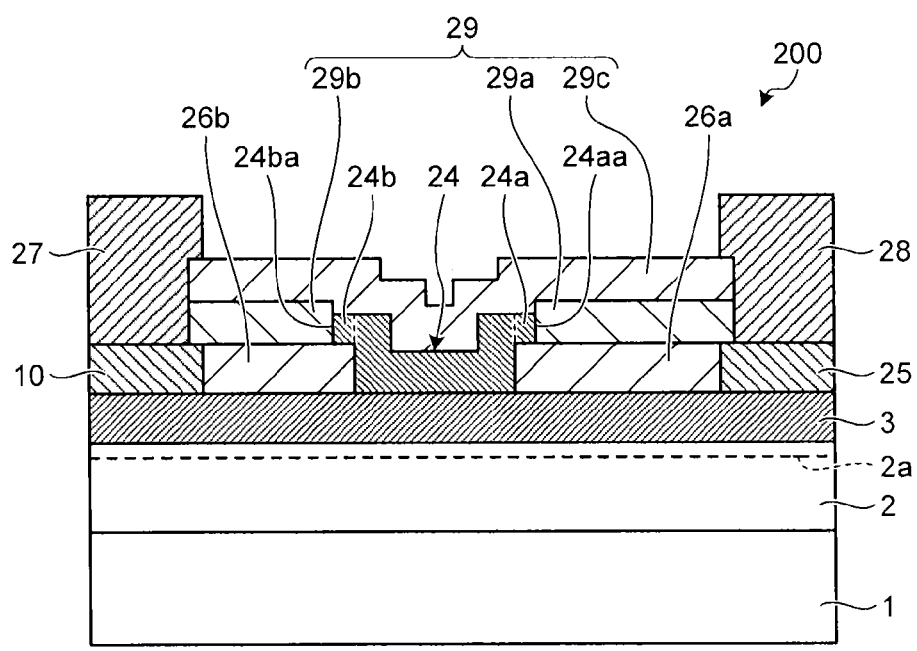
FIG. 8 is a schematic cross-sectional view of a semiconductor device according to a third embodiment.

FIG. 8 is a schematic cross-sectional view of a semiconductor device according to a third embodiment of the present invention. This semiconductor device 200 is a high electron mobility transistor (HEMT), and includes the first semiconductor layer 2, the second semiconductor layer 3, a first electrode 24, a second electrode 25, a third electrode 10, inter-electrode insulation films 26a and 26b, wiring metals 27 and 28, and a dielectric constant adjustment layer 29, which are formed on the substrate 1.

The inter-electrode insulator films 26a and 26b are respectively formed between the first electrode 24, the second electrode 25, and the third electrode 10, on a surface of the second semiconductor layer 3, and are formed of an electric insulator such as SiN, $SiO_2$, or $Al_2O_3$, for example.

The first electrode 24 forms a Schottky contact with the second semiconductor layer 3 and has field plate portions 24a and 24b formed so as to ride on the inter-electrode insulator films 26a and 26b on the second semiconductor layer 3. The first electrode 24 has a Ni/Au structure, for example. This first electrode 24 functions as a gate electrode.

The second electrode 25 is formed on the surface of the second semiconductor layer 3 with the inter-electrode insulator film 26a interposed between the first electrode 24 and the second electrode 25, and forms an ohmic contact with the second semiconductor layer 3. The second electrode 25 has a Ti/Al structure, for example. The second electrode 25 functions as a drain electrode. The third electrode 10 is formed on the surface of the second semiconductor layer 3 with the inter-electrode insulator film 26b interposed between the first electrode 24 and the third electrode 10 and forms an ohmic contact with the second semiconductor layer 3. The third electrode 10 has a Ti/Al structure, for example. This third electrode 10 functions as a source electrode.

The wiring metal 27 is formed on the third electrode 10. The wiring metal 28 is formed on the second electrode 25. The wiring metals 27 and 28 are made of a metal for wiring, such as Al or Au.

The dielectric constant adjustment layer 29 is formed on the inter-electrode insulation films 26a and 26b and is formed of an electric insulator. Further, the dielectric constant adjustment layer 29 has: a first dielectric constant adjustment layer 29a that contacts a lateral end portion 24aa of the field plate portion 24a of the first electrode 24; a first dielectric constant adjustment layer 29b that contacts a lateral end portion 24ba of the field plate portion 24b; and a second dielectric constant adjustment layer 29c formed on the first dielectric constant adjustment layers 29a and 29b.

In this semiconductor device 200, like in the semiconductor device 100, because the first dielectric constant adjustment layer 29a formed of an electric insulator contacts the lateral end portion 24aa of the field plate portion 24a, depletion of the two-dimensional electron gas 2a tends to extend along the first dielectric constant adjustment layer 29a when a reverse voltage is applied between the source electrode (the third electrode 10) and the drain electrode (the second electrode 25), and thus concentration of electric field to the lateral end portion 24aa is mitigated. In addition, the effect of pulling out the carrier by the first dielectric constant adjustment layer 29a is also demonstrated. As a result, in the semiconductor device 200, a carrier density of the two-dimensional electron gas 2a is able to be increased to achieve the reduction of on-resistance or the suppression of current collapse, and the reduction of voltage endurance is able to be prevented.

Materials forming the first dielectric constant adjustment layers 29a and 29b and the second dielectric constant adjustment layer 29c, and preferable values of dielectric constants, layer thicknesses, and the like are the same as their corresponding first dielectric constant adjustment layer 9a or the second dielectric constant adjustment layer 9b in the semiconductor device 100.

Fourth Embodiment

Figure 9:
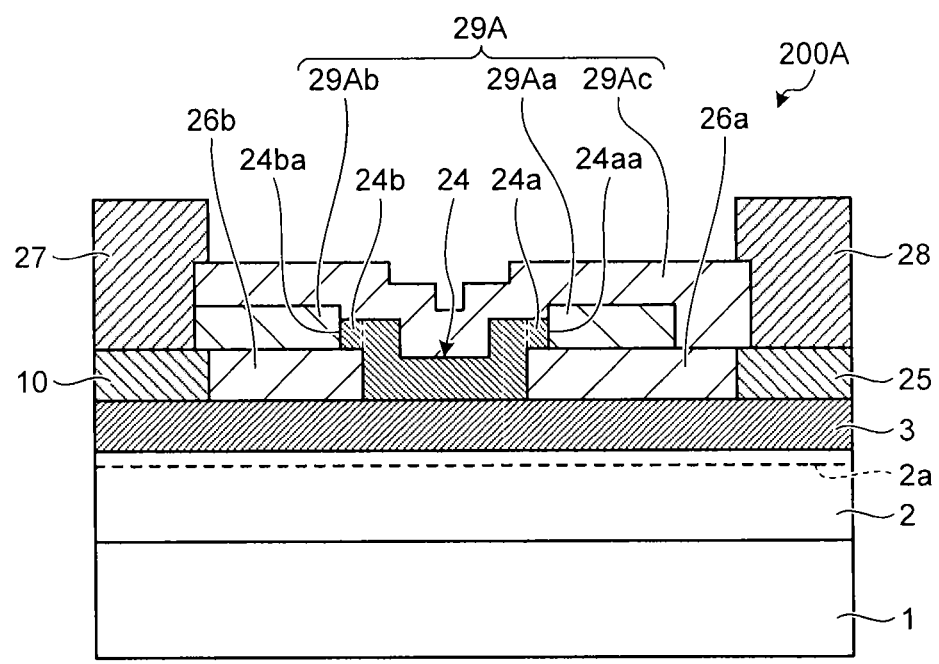
FIG. 9 is a schematic cross-sectional view of a semiconductor device according to a fourth embodiment.

FIG. 9 is a schematic cross-sectional view of a semiconductor device according to a fourth embodiment of the present invention. As illustrated in FIG. 9, this semiconductor device 200A has a structure in which the dielectric constant adjustment layer 29 in the semiconductor device 200 according to the third embodiment illustrated in FIG. 8 is substituted with a dielectric constant adjustment layer 29A.

The dielectric constant adjustment layer 29A is formed on the inter-electrode insulation films 26a and 26b, and formed of an electric insulator. The dielectric constant adjustment layer 29A has: a first dielectric constant adjustment layer 29Aa that contacts the lateral end portion 24aa of the field plate portion 24a of the first electrode 24; a first dielectric constant adjustment layer 29Ab that contacts the lateral end portion 24ba of the field plate portion 24b; and a second dielectric constant adjustment layer 29Ac formed on the first dielectric constant adjustment layers 29Aa and 29Ab.

Materials forming the first dielectric constant adjustment layers 29Aa and 29Ab, and the second dielectric constant adjustment layer 29Ac, and preferable values of dielectric constants, layer thicknesses, and the like may be the same as their corresponding first dielectric constant adjustment layer 29a or 29b, or the second dielectric constant adjustment layer 29c. Further, the first dielectric constant adjustment layer 29Aa is formed partially on the inter-electrode insulator film 26a from the lateral end portion 24aa of the field plate portion 24a toward the second electrode 25. Accordingly, a part of the second dielectric constant adjustment layer 29Ac covers a surface of the inter-electrode insulator film 26a on the second electrode 25 side.

Also in this semiconductor device 200A, like in the semiconductor device 200, the effect of facilitating the extending of the depletion and the effect of pulling out the carrier are demonstrated by the first dielectric constant adjustment layer 29Aa. As a result, a carrier density of the two-dimensional electron gas 2a is able to be increased to achieve the reduction of the on-resistance or the suppression of the current collapse, and the reduction of the voltage endurance is able to be prevented.

In a specific example, the field plate portions 24a and 24b of the first electrode 24 have a layer thickness of 350 nm, and the first dielectric constant adjustment layers 29Aa and 29Ab have a layer thickness of about the same. The inter-electrode insulation films 26a and 26b are made of $SiO_2$ having a dielectric constant of 3.8. The first dielectric constant adjustment layers 29Aa and 29Ab are made of $Si_3N_4$ having a dielectric constant $\in_r 1$ of 7.9. The second dielectric constant adjustment layer 29Ac is made of a polyimide having a dielectric constant $\in_r 2$ of 3.0. An amount of the carrier pulled out from the lateral end portion 24aa of the field plate portion 24a of the first electrode 24 varies depending on a capacity between the lateral end portion 24aa and a top surface of the inter-electrode insulator film 26a. Therefore, by forming the first dielectric constant adjustment layer 29Aa made of $Si_3N4$ having a dielectric constant $\in_r 1$ of a large value in the vicinity of the lateral end portion 24aa and forming the second dielectric constant adjustment layer 29Ac made of a polyimide having a dielectric constant $\in_r 2$ of a relatively small value in the other region on the second electrode 25 side, the effect of being able to reduce the capacity between the wiring metals 27 and 28 is obtained as compared with an example in which the first dielectric constant adjustment layer 29Aa made of $Si_3N_4$ is formed on the entire surface.

The semiconductor devices according to the first and second embodiments are Schottky barrier diodes, while the semiconductor devices according to the third and fourth embodiments are high electron mobility transistors (HEMT). However, the present invention is applicable to other various types of semiconductor devices. For example, the semiconductor device 200 according to the third embodiment may be structured as a metal insulator semiconductor (MIS) HEMT type field effect transistor by interposing a gate insulation film between the first electrode 24 and the second semiconductor layer 3.

In the embodiments described above, the material referred to as SiN or $SiO_2$ represents a group generally referred to as SiN or $SiO_2$. That is, for example, the material described as SiN or $SiO_2$ includes $SiN_x$ or SiON.

According to an embodiment of the present invention, a semiconductor device is realized, by which reduction of on-resistance or suppression of current collapse is achieved and reduction of voltage endurance is prevented.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A semiconductor device, comprising:
  a first semiconductor layer that is formed on a substrate and formed of a nitride-based semiconductor;
  a second semiconductor layer that is formed on a surface of the first semiconductor layer and formed of a nitride-based semiconductor having a wider band-gap than the first semiconductor layer;

a first electrode that is formed on a surface of the second semiconductor layer;
a second electrode that is formed on the surface of the second semiconductor layer;
an inter-electrode insulator film that is formed between the first electrode and the second electrode on the surface of the second semiconductor layer; and
a dielectric constant adjustment layer that is formed on the inter-electrode insulator film and formed of an electric insulator, wherein
the first electrode has a field plate portion formed so as to ride on the inter-electrode insulator film, and
the dielectric constant adjustment layer has a first dielectric constant adjustment layer that contacts a lateral end portion of the field plate portion and a second dielectric constant adjustment layer formed on the first dielectric constant adjustment layer,
wherein when a dielectric constant of the first dielectric constant adjustment layer is $\in_r 1$ and a dielectric constant of the second dielectric constant adjustment layer is $\in_r 2$: $1.5 < \in_r 2 < 9$; and $\in_r 1 \geq \in_r 2$.

2. The semiconductor device according to claim 1, wherein a ratio of an electric charge of a carrier pulled out from the lateral end portion of the field plate portion of the first electrode through the inter-electrode insulator film and the first dielectric constant adjustment layer, to an electric charge of a carrier pulled out from a bottom surface of the first electrode is 65% or larger.

3. The semiconductor device according to claim 1, wherein a dielectric constant $\in_r 1$ of the first dielectric constant adjustment layer satisfies a relation of $3 \leq \in_r 1 \leq 9$.

4. The semiconductor device according to claim 1, wherein the first dielectric constant adjustment layer includes at least one of $SiO_2$, $Si_3N_4$, $Al_2O_3$, and $MgO$.

5. The semiconductor device according to claim 1, wherein the first dielectric constant adjustment layer includes a polyimide film in which ceramic particles of at least one of $TiO_2$, $SiO_2$, $Al_2O_3$, $HfO$, $ZrO$, $HfSi_xO_y$, and $ZrSi_xO_y$ are mixed.

6. The semiconductor device according to claim 1, wherein the first dielectric constant adjustment layer includes a polymeric material including at least one metal of Cu, Ni, Ag, Al, Zn, Co, Fe, and Mn.

7. The semiconductor device according to claim 1, wherein the first dielectric constant adjustment layer includes a silicone resin material.

8. The semiconductor device according to claim 1, wherein the first dielectric constant adjustment layer includes a high-dielectric polymeric material.

9. The semiconductor device according to claim 1, wherein the first electrode is an anode electrode, the second electrode is a cathode electrode, and the semiconductor device is a diode.

10. The semiconductor device according to claim 1, wherein the first electrode is a gate electrode, the second electrode is a drain electrode, and the semiconductor device is a high electron mobility transistor.

11. A semiconductor device, comprising:
a first semiconductor layer that is formed on a substrate and formed of a nitride-based semiconductor;
a second semiconductor layer that is formed on a surface of the first semiconductor layer and formed of a nitride-based semiconductor having a wider band-gap than the first semiconductor layer;
a first electrode that is formed on a surface of the second semiconductor layer;
a second electrode that is formed on the surface of the second semiconductor layer;
an inter-electrode insulator film that is formed between the first electrode and the second electrode on the surface of the second semiconductor layer; and
a dielectric constant adjustment layer that is formed on the inter-electrode insulator film and formed of an electric insulator, wherein
the first electrode has a field plate portion formed so as to ride on the inter-electrode insulator film, and
the dielectric constant adjustment layer has a first dielectric constant adjustment layer that contacts a lateral end portion of the field plate portion and a second dielectric constant adjustment layer formed on the first dielectric constant adjustment layer,
wherein a ratio of an electric charge of a carrier pulled out from the lateral end portion of the field plate portion of the first electrode through the inter-electrode insulator film and the first dielectric constant adjustment layer, to an electric charge of a carrier pulled out from a bottom surface of the first electrode is 65% or larger.

12. The semiconductor device according to claim 11, wherein the first dielectric constant adjustment layer includes at least one of $SiO_2$, $Si_3N_4$, $Al_2O_3$, and $MgO$.

13. The semiconductor device according to claim 11, wherein the first dielectric constant adjustment layer includes a polyimide film in which ceramic particles of at least one of $TiO_2$, $SiO_2$, $Al_2O_3$, $HfO$, $ZrO$, $HfSi_xO_y$, and $ZrSi_xO_y$ are mixed.

14. The semiconductor device according to claim 11, wherein the first dielectric constant adjustment layer includes a polymeric material including at least one metal of Cu, Ni, Ag, Al, Zn, Co, Fe, and Mn.

15. A semiconductor device, comprising:
a first semiconductor layer that is formed on a substrate and formed of a nitride-based semiconductor;
a second semiconductor layer that is formed on a surface of the first semiconductor layer and formed of a nitride-based semiconductor having a wider band-gap than the first semiconductor layer;
a first electrode that is formed on a surface of the second semiconductor layer;
a second electrode that is formed on the surface of the second semiconductor layer;
an inter-electrode insulator film that is formed between the first electrode and the second electrode on the surface of the second semiconductor layer; and
a dielectric constant adjustment layer that is formed on the inter-electrode insulator film and formed of an electric insulator, wherein
the first electrode has a field plate portion formed so as to ride on the inter-electrode insulator film, and
the dielectric constant adjustment layer has a first dielectric constant adjustment layer that contacts a lateral end portion of the field plate portion and a second dielectric constant adjustment layer formed on the first dielectric constant adjustment layer,
wherein the first dielectric constant adjustment layer includes a silicone resin material or a high-dielectric polymeric material.

16. The semiconductor device according to claim 15, wherein the first dielectric constant adjustment layer includes a silicone resin material.

17. The semiconductor device according to claim 15, wherein the first dielectric constant adjustment layer includes a high-dielectric polymeric material.

* * * * *